US006822297B2

(12) United States Patent
Nandakumar et al.

(10) Patent No.: US 6,822,297 B2
(45) Date of Patent: Nov. 23, 2004

(54) ADDITIONAL N-TYPE LDD/POCKET IMPLANT FOR IMPROVING SHORT-CHANNEL NMOS ESD ROBUSTNESS

(75) Inventors: Mahalingam Nandakumar, Richardson, TX (US); Song Zhao, Dallas, TX (US); Youngmin Kim, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 163 days.

(21) Appl. No.: 09/876,292

(22) Filed: Jun. 7, 2001

(65) Prior Publication Data

US 2002/0185682 A1 Dec. 12, 2002

(51) Int. Cl.$^7$ .............................................. H01L 23/62
(52) U.S. Cl. ...................... 257/356; 257/335; 257/336; 257/339; 257/344; 257/345; 257/347; 257/348; 257/349; 257/355; 257/357; 257/358; 257/361; 257/362; 458/282; 458/298; 458/910
(58) Field of Search ................................ 257/335, 336, 257/339, 344, 345, 347, 348, 349, 355, 356, 357, 358, 361, 362; 438/282, 246, 910

(56) References Cited

U.S. PATENT DOCUMENTS 5,023,678 A 6/1991 Kinzer
5,355,011 A * 10/1994 Takata ........................ 257/408

(List continued on next page.)

FOREIGN PATENT DOCUMENTS

| FR | 2 798 204 A1 | 1/2001 | | |
|---|---|---|---|---|
| JP | 05-283688 | * | 10/1993 | ................. 257/344 |

OTHER PUBLICATIONS

Kunikiyo Tatsuya, "Semiconductor Device and Ms Manufacture" Patent Abstracts of Japan, vol. 1995, No. 02, Mar. 31, 1995, Publication No. 06318698, Publication Date Nov. 15, 1994.

(List continued on next page.)

Primary Examiner—Tom Thomes
Assistant Examiner—Edgardo Ortiz
(74) Attorney, Agent, or Firm—W. James Brady, III; Frederick J. Telecky, Jr.

(57) ABSTRACT

A short-channel NMOS transistor in a p-well, bordered laterally on each side by an isolation region and vertically by a channel stop region, has a n-source and a n-drain, each comprising a shallow region extending to the transistor gate and a deeper region recessed from the gate, and both having a depletion region when reverse biased. The shallow regions are surrounded in part by an enhanced p-doping implant pocket. The transistor further has in these regions of enhanced p-doping another region of a p-resistivity higher than the remainder of the semiconductor. These regions extend laterally approximately from the inner border of the respective shallow region to the inner border of the respective recessed region, and vertically from a depth just below the depletion regions of source and drain to approximately the top of the channel stop regions.

According to the invention, these regions of higher p-type resistivity are created after gate definition by an ion implant of compensating n-doping, such as arsenic or phosphorus, using the same photomask already used for implants creating the extended source and drain and the pockets of enhanced p-doping.

In an ESD event, these regions of higher resistivity increase the current gain of the parasitic lateral npn bipolar transistor and thus raise the current It2, which initiates the thermal breakdown with its destructive localized heating, thereby improving ESD robustness.

11 Claims, 3 Drawing Sheets

U.S. PATENT DOCUMENTS

| | | | |
|---|---|---|---|
| 5,371,394 A | | 12/1994 | Ma et al. |
| 5,449,937 A | * | 9/1995 | Arimura et al. ............ 257/345 |
| 5,472,897 A | * | 12/1995 | Hsu et al. ...................... 437/44 |
| 5,536,959 A | * | 7/1996 | Kellam ...................... 257/327 |
| 5,712,501 A | * | 1/1998 | Davies et al. ............... 257/335 |
| 5,773,863 A | * | 6/1998 | Burr et al. .................. 257/344 |
| 5,891,792 A | * | 4/1999 | Shih et al. .................. 138/525 |
| 6,005,285 A | * | 12/1999 | Gardner et al. ............. 257/607 |
| 6,040,603 A | * | 3/2000 | Yang .......................... 257/344 |
| 6,143,594 A | * | 11/2000 | Tsao et al. .................. 438/199 |
| 6,163,053 A | * | 12/2000 | Kawashima ............... 257/335 |
| 6,174,778 B1 | | 1/2001 | Chen et al. |
| 6,198,135 B1 | * | 3/2001 | Sonoda ....................... 257/355 |
| 6,437,406 B1 | * | 8/2002 | Lee ............................ 257/349 |
| 6,452,236 B1 | * | 9/2002 | Nadakumar et al. ........ 257/356 |

OTHER PUBLICATIONS

Morii Tomoyuki, "MOS Type Semiconductor Device and Manufacture Thereof" Patent Abstracts of Japan, vol. 014, No. 348, Jul. 26, 1990, Publication No. 02119269, Publication Date May 7, 1990.

* cited by examiner

ADDITIONAL N-TYPE LDD/POCKET IMPLANT FOR IMPROVING SHORT-CHANNEL NMOS ESD ROBUSTNESS

FIELD OF THE INVENTION

The present invention is related in general to the field of electronic systems and semiconductor devices, and more specifically to structure and fabrication methods of short-channel MOS transistors, which have an additional implant under the LDD/pocket compared to standard technology.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine model", MM); it can generate transients with significantly higher rise times than the HBM ESD source. A third source is described by the "charged device model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an NMOS device whose drain is connected to the pin to be protected and whose source is tied to ground. The protection level or failure threshold can be set by varying the NMOS device width from the drain to the source under the gate oxide of the NMOS device. Under stress conditions, the dominant current conduction path between the protected pin and ground involves the parasitic bipolar transistor of that NMOS device. This parasitic bipolar transistor operates in the snapback region under pin positive with respect to ground stress events.

The dominant failure mechanism, found in the NMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak NMOS device temperature, at which second breakdown is initiated, is known to increase with the stress current level.

Many circuits have been proposed and implemented for protecting ICs from ESD. One method that is used to improve ESD protection for ICs is biasing the substrate of ESD protection circuits on an IC. Such substrate biasing can be effective at improving the response of a multi-finger MOS transistor that is used to conduct an ESD discharge to ground. However, substrate biasing can cause the threshold voltages for devices to change from their nominal values, which may affect device operation. In addition, substrate biasing under steady-state conditions causes heat generation and increases power losses.

Solutions offered in known technology require additional IC elements, silicon real estate, and/or process steps (especially photomask alignment steps). Their fabrication is, therefore, expensive. Examples of device structures and methods are described in U.S. Pat. No. 5,539,233, issued Jul. 23, 1996 (Amerasekera et al., "Controlled Low Collector Breakdown Voltage Vertical Transistor for ESD Protection Circuits"); U.S. Pat. No. 5,793,083, issued Aug. 11, 1998 (Amerasekera et al., "Method for Designing Shallow Junction, Salicided NMOS Transistors with Decreased Electrostatic Discharge Sensitivity"); U.S. Pat. No. 5,940,258, issued Aug. 17, 1999 (Duvvury, "Semiconductor ESD Protection Circuit"); U.S. Pat. No. 6,137,144, issued Oct. 10, 2000, and U.S. Pat. No. 6,143,594, issued Nov. 7, 2000 (Tsao et al, "On-Chip ESD Protection in Dual Voltage CMOS); and U.S. patent application Ser. No. 09/456,036, filed Dec. 12, 1999 (Amerasekera et al., "Electrostatic Discharge Device and Method").

The influence of substrate well profiles on the device ESD performance is investigated, for instance, in "Influence of Well Profile and Gate Length on the ESD Performance of a Fully Silicided 0.25 $\mu$m CMOS Technology" (K. Bock, C. Russ, G. Badenes, G. Groeseneken and L. Deferm, Proc. EOS/ESD Symp., 1997, pp. 308–315). However, known technology recommends only a lower epitaxial doping or a lower implant dose as methods to increase the p-well resistance. These approaches are especially insufficient when the channel length of MOS transistors is progressively reduced, driven by the continuing miniaturization trend.

The challenge of cost reduction implies a drive for minimizing the number of process steps, especially a minimum number of photomask steps, and the application of standardized process conditions wherever possible. These constraints should be kept in mind when additional process steps or new process conditions are proposed to improve ESD insensitivity without sacrificing any desirable device characteristics. An urgent need has, therefore, arisen for a coherent, low-cost method of enhancing ESD insensitivity without the need for additional, real-estate consuming protection devices. The device structure should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

A short-channel NMOS transistor in a p-well, bordered laterally on each side by an isolation region and vertically by a channel stop region, has a n-source and a n-drain, each comprising a shallow region extending to the transistor gate and a deeper region recessed from the gate, and both having a depletion region when reverse biased. The shallow regions are surrounded in part by an enhanced p-doping implant pocket. The transistor further has in these regions of enhanced p-doping another region of a p-resistivity higher than the remainder of the semiconductor. These regions extend laterally approximately from the inner border of the respective shallow region to the inner border of the respective recessed region, and vertically from a depth just below the depletion regions of source and drain to approximately the top of the channel stop regions.

According to the invention, these regions of higher p-type resistivity are created after gate definition by an ion implant of compensating n-doping, such as arsenic or phosphorus, using the same photomask already used for implants creating the extended source and drain and the pockets of enhanced p-doping.

In an ESD event, these regions of higher resistivity increase the current gain of the parasitic lateral npn bipolar transistor and thus raise the current It2, which initiates the thermal breakdown with its destructive localized heating, thereby improving ESD robustness.

When the gate, source and substrate terminals are at 0 V and the drain at positive potential, the current gain β of the lateral bipolar npn transistor in the ESD event is defined as $$\beta = (Id - Igen)/(Igen - Isub),$$

where

Id=drain current,
Igen=Ib+Isub,
Ib=base current,
Isub=hole current from the collector junction through the substrate to the backside contact.

It is an aspect of the invention that the regions of higher resistivity are the substrate of the transistor, enabling full functioning of the transistor while not affecting operation of neighboring active devices.

Another aspect of the invention is that the regions of higher resistivity improve the ESD protection of the transistor without decreasing latch-up robustness or increasing inadvertent substrate current-induced body biasing of neighboring transistors.

Another aspect of the invention is that it is equally applicable to PMOS transistors; the conductivity types of the semiconductor and the ion implant types are simply reversed.

The method of fabricating the regions of higher resistivity under the active area of a high-voltage NMOS transistor having a gate comprises the steps of depositing a photoresist layer over the transistor and opening a window in this layer over the active area of the transistor; then implanting, at high energy, n-doping ions into the p-type semiconductor substrate through the window, creating a deep region having a net p-type doping lower than that of the p-type semiconductor remote from the transistor active area. A preferred depth of the regions is between 50 and 150 nm. A region too deep would require higher implant energy with possibly more damage and thus higher junction leakage current or junction isolation failure.

It is an essential aspect of the present invention that this high-energy ion implant is performed without the need for a new photomask step. This economical feature renders the additional high-energy ion implant step of the present invention exceedingly inexpensive.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Patent Applications No. 60/263,619, filed on Jan. 23, 2001 (Salling, "Structure and Method of MOS Transistor having Increased Substrate Resistance"), and # . . . (TI-31089), filed on May 28, 2001 (Nandakumar et al., "Method of Channel Implant for Improving NMOS ESD Robustness").

Figure 1:
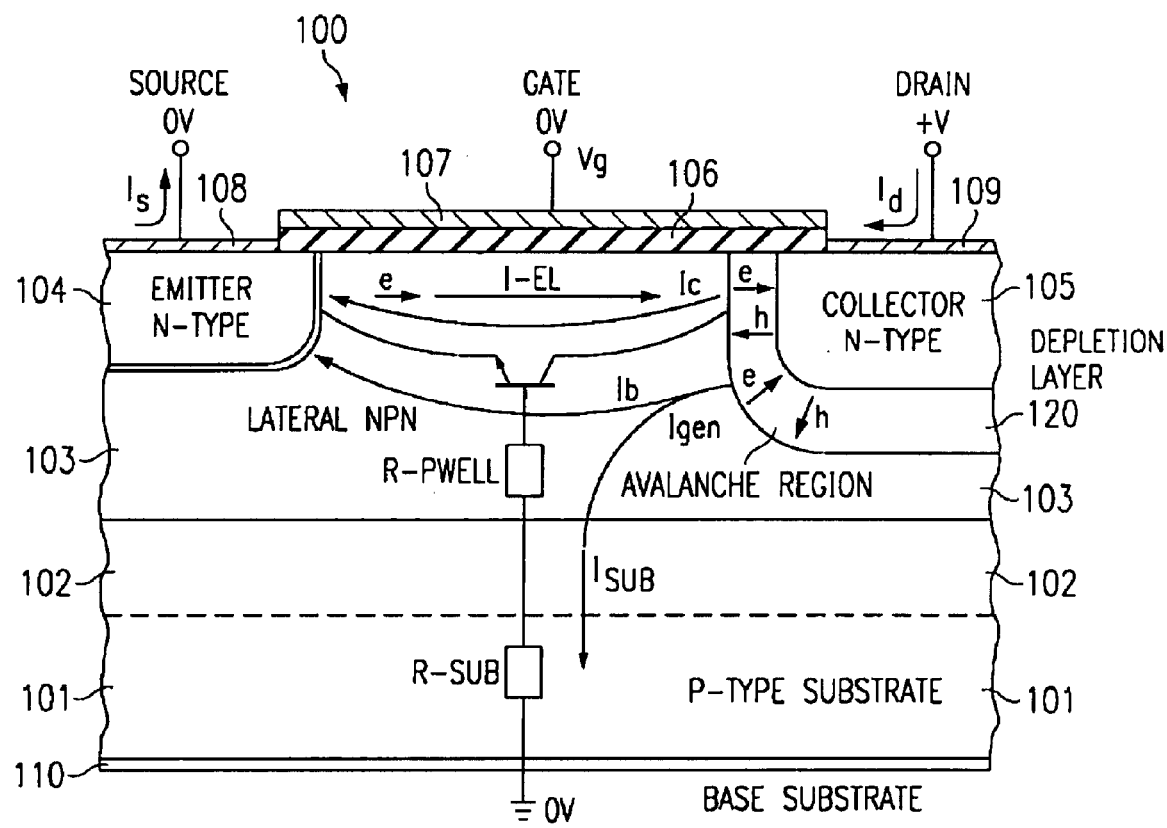
FIG. 1 is a simplified and schematic cross section through a lateral MOS transistor, illustrating the current flow at an electrostatic discharge event.

The impact of the present invention can be most easily appreciated by highlighting the shortcomings of the known technology. The schematic cross section of FIG. 1 illustrates a commonly used integrated circuit (IC) component 100 in an ESD protection circuit, namely an NMOS transistor which operates in the mode of a lateral bipolar npn transistor during an ESD event and provides a low impedance current path to ground. The IC is formed in a semiconductor of a "first conductivity" type; in the example of FIG. 1, this "first conductivity" is p-type, the MOS transistor is an NMOS transistor, and the lateral bipolar transistor is a npn transistor. In present manufacturing, the first conductivity type semiconductor is created by the net doping due to a "substrate" and a "well".

As defined herein, the term "substrate" refers to the starting semiconductor wafer. In present manufacturing, the substrate typically has p-type doping. For clarity, this case is also selected as the basis for the following discussions. It should be stressed, however, that the invention and all description also cover the case where the substrate has n-type doping. In FIG. 1, the substrate is designated 101. Frequently, but not necessarily, an epitaxial layer 102 of the same conductivity type as the substrate has been deposited over the substrate 101; in this case the term "substrate" refers to epitaxial layer 102 plus starting semiconductor 101. For the conductivity example selected for FIG. 1, a p-well 103 has been formed by localized acceptor ion implantation and annealing. An n-plus source region 104 (the emitter of the bipolar transistor) and drain region 105 (the collector of the bipolar transistor) were formed by shallow ion implants of donors. The surface between the emitter 104 and the collector 105 is covered by gate oxide layer 106. Layers 107, 108, 109, and 110 provide metallic contacts to the gate, emitter, collector and the wafer backside, respectively.

FIG. 1 further shows that emitter 108, gate 107 and wafer backside 110 are electrically connected to ground potential (0 V). A positive voltage spike at the collector, as caused by an ESD event, applies a reverse bias to the collector/base junction; the base is the substrate 101 (in some devices, epitaxial layer 102 plus the substrate 101); the depletion layer of the space charge region is designated 120. When the electric field in the depletion region 120 exceeds the breakdown field, avalanching occurs and forms electron/hole pairs. Electrons flow into the collector, and holes flow into the p-type base.

Figure 2:
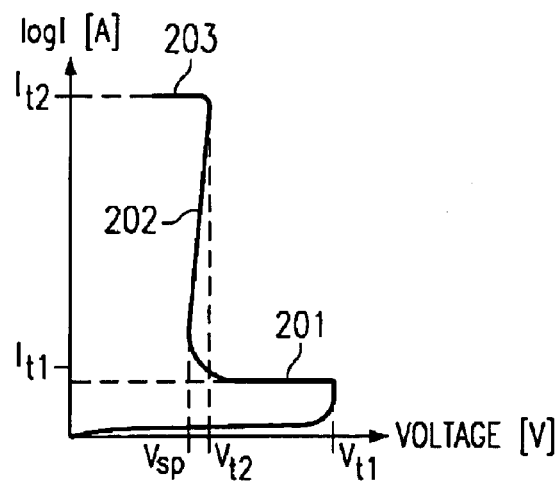
FIG. 2 is a schematic plot of drain (collector) current, on a logarithmic scale, as a function of drain voltage, on a linear scale, illustrating the onset of the second breakdown phenomenon.

This hole current Isub flows from the collector junction through the substrate to the backside contact 110, causing a voltage drop across the resistors R-pwell and R-sub, which positive (forward) biases the emitter/base junction. This emitter forward bias is proportional to the effective "substrate resistance" equal to the sum of the resistance components in the current path, which are schematically shown as R-pwell and R-sub in FIG. 1. Those of the electrons injected from the emitter into the base which reach the collector depletion layer will participate in the avalanche mechanism. The electron concentration will be multiplied in accordance with the electric field dependent avalanche multiplication factor. The resulting reduction of the device impedance is reflected in a "snap back" 201 in the current-voltage characteristic, which corresponds to a "turn on" of the bipolar transistor. FIG. 2 plots the collector (or drain) current I (on a logarithmic scale) as a function of drain voltage V (on a linear scale). As illustrated in FIG. 2, this snap-back 201 occurs at the collector/drain voltage Vt1 with an associated collector/drain current It1. The field dependence of the avalanche multiplication factor is responsible for establishing a new stable current/voltage equilibrium 202. At high electron injection levels, base conductivity modulation also contributes towards making the device impedance positive again. It should be mentioned that the lateral npn transistor also protects against negative ESD pulses. The collector 105 (in FIG. 1) now acts as emitter and diverts the ESD current to the backside substrate contact 110 and to the now reverse biased emitter 104, which now acts as collector.

The current carrying capability of the device is limited by thermal effects in the avalanching collector depletion layer. A number of effects (such as the increase of intrinsic carrier concentration, a reduced carrier mobility, a decrease in thermal conductivity, and a lowering of the potential barrier for tunnel currents) contribute to the onset of the second (thermal) breakdown (203 in FIG. 2). The second breakdown trigger current It2 is very sensitive to the device design, especially the doping profiles. Second breakdown results in junction melting and in an irreversible increase in leakage currents. It must, therefore, be avoided for normal device operation.

It is important for the present invention to conclude from FIG. 1 and the above discussion of FIG. 2 that increasing the resistors R-pwell and/or R-sub will lead to an earlier turn-on of the emitter and to a reduction of the current contribution of the avalanche mechanism. This is reflected in an increase of the second breakdown threshold current It2. As was pointed out in the above-referenced publication by K. Bock et al., the p-well resistance R-pwell, and thus It2, can be modified by the p-well doping. However, known technology recommended only a lower substrate (or epitaxial) doping or a lower implant dose as methods to increase the p-well resistance.

The present invention discloses an additional, compensating n-type implant into the p-well to produce a lowly doped p-region below the MOS transistor depletion region and above the channel stop to improve the bipolar current gain β.

As defined herein, geometrical and positional terms such as "vertical", "below", "above", "shallow", and "deep", "top", "depth"are used with the active surface of the semiconductor as reference line. According to this definition, the surface has "horizontal" orientation. The integrated circuit is built into this active semiconductor surface. The schematic cross sections of FIGS. 1 and 3 illustrate these positional interrelations.

Figure 3:
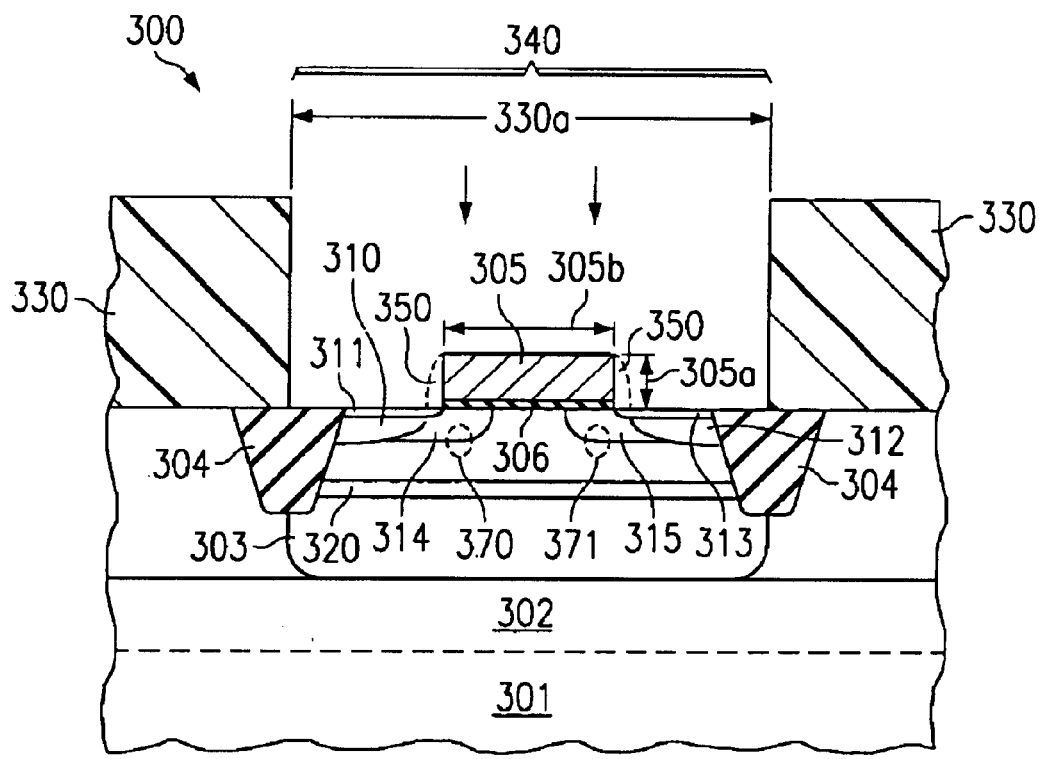
FIG. 3 schematically presents a cross section of a lateral MOS transistor with a photoresist window opened for the high energy ion implant according to the invention.
Figure 4:
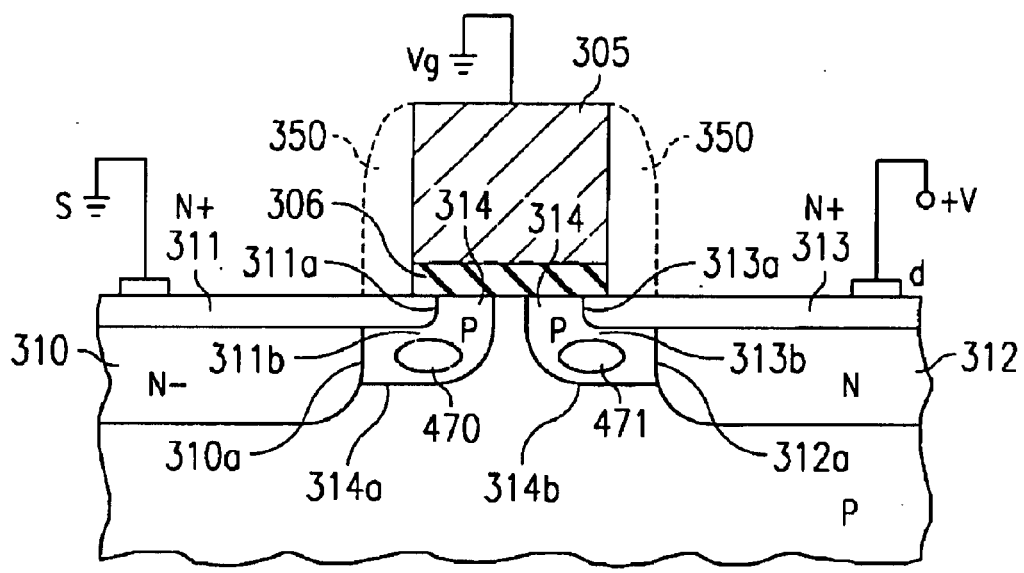
FIG. 4 illustrates schematically, yet in more detail, the cross section of the regions of the compensating ion implant of the invention.

The structure of the modified p-well doping and p-well resistance R-pwell according to the present invention is described in FIGS. 3 and 4, and the flexible and economical method for tailoring R-pwell according to the invention is described in FIGS. 5 to 10. While the examples depicted embody the experimental conditions for an NMOS transistor, analogous considerations hold for the conditions of a PMOS transistor.

FIG. 3 shows in simplified and schematic (not to scale) manner a small portion of an IC having on its surface an MOS transistor, generally designated 300, at a certain stage of its fabrication process according to the invention. The invention applies to NMOS as well as PMOS transistors fabricated into semiconductor substrate material. Here, the substrate comprises a semiconductor wafer 301 of p-type doping (onto which, for some devices, an epitaxial layer 302, also of p-type doping, has been deposited). For clarity, the description and discussion of the invention will be for a p-type semiconductor. However, the invention is also applicable if an n-type substrate is used. The semiconductor material may be silicon, silicon germanium, gallium arsenide or any other semiconductor material used in IC fabrication.

The resistivity of the semiconductor substrate, into which the MOS transistor is fabricated, ranges from about 1 to 50 Ωcm (this is also the resistivity of the epitaxial layer). A well 303 of a "first" conductivity type has been fabricated into the substrate. In FIG. 3, window 330a in photoresist 330 is used to create the p-well shown; in other circuit designs, the p-well may extend further. For an NMOS transistor, this "first" conductivity refers to p-type, for a PMOS transistor, to n-type. Silicon dioxide isolation trenches 304 define the active area of the lateral transistor within the p-well. For the gate 305 of the short-channel MOS transistor, poly-silicon or another conductive material is usually chosen; its thickness 305a is commonly between 140 and 180 nm, and the width 305b less than 0.2 μm, typically 0.1 μm. The gate insulator 306 (silicon dioxide, nitrided SiO2, or others) has a physical thickness between 0.5 and 5 nm.

FIG. 3 shows a deep source 310 and an extended source 311, further a deep drain 312 and an extended drain 313. The extended source and drain are prepared by low-energy, shallow implants (depth typically between 25 and 40 nm), the deep source and drain by medium-energy implants (depth typically between 100 and 140 nm) as part of the process flow shown in FIGS. 5 to 10. For the fabrication by ion implantation, a window 330a in a photoresist layer 330 is used; window 330a determines the lateral extent and active area of the MOS transistor. The same photoresist and window are used for the additional p-type implant creating the medium-conductivity channel stop layer 320 and the threshold adjust implant directly under the gate (not shown in FIG. 3).

FIG. 3 further shows the enhanced p-doping implant regions 314, which surrounds part of the shallow source 311, and 315, which surrounds part of the shallow drain 313.

After definition of gate 305, the window 330a is further used for the high-energy, compensating n-type implant of the present invention. This implant is performed for modifying the well resistivity in two regions 370 and 371 to an average value at least an order of magnitude higher than the resistivity value of the semiconductor of the first conductivity type. It should be noted in passing that the thickness of the photoresist layer 330 is larger than the thickness solely required to block the lower energy implants. Preferably, the photoresist layer thickness is between 1.5 and 2.0 μm. If the high-energy implant accompanies the medium-energy implant, non-conductive sidewalls 350 are typically present as part of the gate structure.

In the preferred embodiment of FIG. 3, these regions 370 and 371 of higher resistivity extend laterally approximately from the inner border of the respective shallow region (311 and 313, respectively) to the inner border of the respective recessed region (310 and 312, respectively). The regions of higher resistivity extend vertically from a depth just below the depletion regions of source (311 and 310) and drain (313 and 312) to approximately the top of the channel stop region 320.

Another embodiment of the location of the compensating implant regions is shown in more detail in FIG. 4. Here, the regions of the compensating implant are designated 470 and 471. Also shown are the deep source 310 and the extended source 311, as well as the deep drain 312 and the extended drain 313. As can be seen, both deep source 310 and deep drain 312 are recessed relative to their respective extended parts 311 and 313. Further shown are the regions 314 of enhanced p-doping implant, which surround in part the extended source and drain (these regions are often referred to as "pockets" or "halos"). The regions 470 and 471 of the compensating n-type implant (and thus of higher p-resistivity) are located within the regions 314 of enhanced p-doping. These regions of higher p-resistivity extend laterally approximately from the inner borders (311a and 313a, respectively) of the respective shallow regions 311 and 313 to the inner borders (310a and 312a, respectively) of the respective recessed regions 310 and 312. The regions of higher p-resistivity extend vertically from a depth just below the depletion regions of source and drain (311b and 313b, respectively) to approximately the border of the regions of enhanced p-doping (314a and 314b, respectively). The depth of the regions 370 and 371 of higher resistivity is about 30 to 50 nm from the surface.

Comparing FIG. 4 with FIG. 1 indicates that the regions 470 and 471 of higher resistivity are in the locations where avalanche can be expected in case of ESD event. These regions are, therefore, optimally located to increase current spreading and $\beta$, and thus to avoid localized heating by second breakdown.

For NMOS transistors, the semiconductor well and substrate of the first conductivity type (p-type) (including any epitaxial layer) has dopant species selected from a group consisting of boron, aluminum, gallium, and indium. Source, drain, their extensions, and the region of higher resistivity within the semiconductor of the first conductivity type have a dopant species selected from a group consisting of arsenic, phosphorus, antimony, and bismuth.

For PMOS transistors, the semiconductor well of the first conductivity type (n-type) has dopant species selected from a group consisting of arsenic, phosphorus, antimony, and bismuth. Source, drain, their extensions, and the region of higher resistivity within the semiconductor of the first conductivity type have a dopant species selected from a group consisting of boron, aluminum, gallium, indium, and lithium.

The precise selection of a successful dose and energy for the compensating implant depends on the p-well background and device operating conditions. For typical conditions, preferred doses are in the 2.0 to 5.0 E+12 cm-2 range, and preferred energies in the 120 to 160 keV range. The maximum $\beta$ achieved is between 60 and 100.

The method and process flow for fabricating an IC MOS transistor with increased substrate resistance is outlined in the schematic and simplified FIGS. 5 to 10 for the example of an NMOS transistor; analogous process steps apply for the fabrication of a PMOS transistor.

Figure 5:
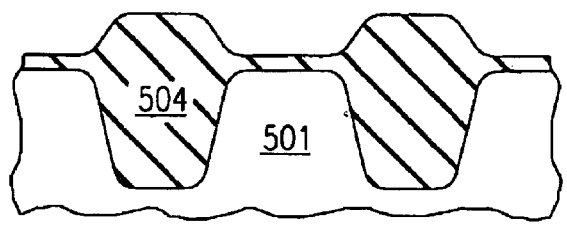
FIGS. 5–10 are schematic cross sections illustrating the process flow for fabrication of a transistor in accordance with the invention.
Figure 6:
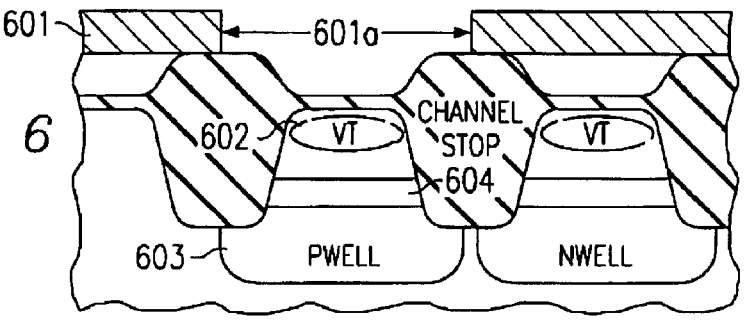
Figure 7:
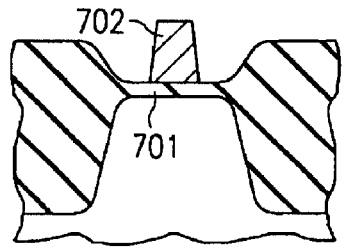
Figure 8:
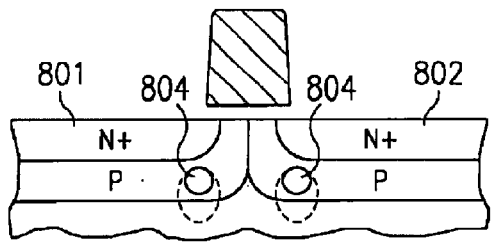
Figure 9:
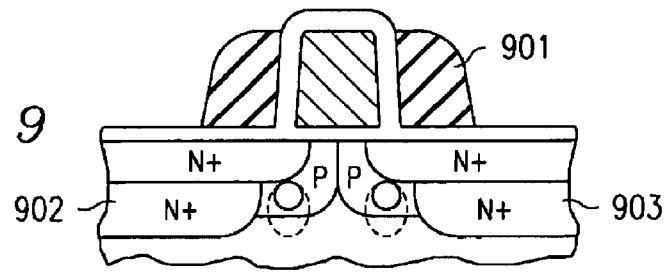
Figure 10:
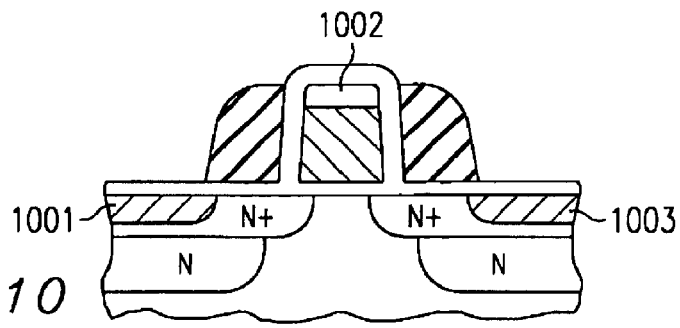

FIG. 5: selecting a p-type semiconductor 501 as substrate; may be an epitaxial material;

FIG. 5: forming non-conductive electrical isolation regions 504 into p-type semiconductor 501 for defining the lateral boundaries of the NMOS transistor active area;

FIG. 6: depositing a first photomask layer 601 and opening a window 601a therein, exposing the surface of the area between the isolation regions;

FIG. 6: implanting low-energy p-doping ions into the exposed surface area, creating a shallow layer 602 suitable for adjusting the threshold voltage;

FIG. 6: implanting high-energy p-doping ions into the exposed surface area, creating the p-well 603;

FIG. 6: implanting medium-energy p-doping ions into the exposed surface area, creating a deep layer 604 suitable as channel stop;

FIG. 6: removing the first photoresist layer;

FIG. 7: growing over the surface an insulating layer, such as silicon dioxide, suitable as gate dielectric 701, covering said transistor area;

FIG. 7: depositing a layer of poly-silicon or other conductive material onto the insulating layer;

FIG. 7: protecting a portion of the poly-silicon and etching the remainder thereof, defining the gate area 702 of the transistor;

FIG. 8: depositing a second photoresist layer and opening a window therein, exposing the surface of the area between the isolation regions;

FIG. 8: implanting, at low energy, n-doping ions into the exposed surface area, creating shallow n-doped layers under the surface, suitable as extended source 801 and drain 802 of the transistor;

FIG. 8: implanting, at medium energy, p-doping ions, creating enhanced p-doping regions ("pockets", "halos") 803 surrounding in part the shallow n-doped layers 801 and 802 of extended source and drain;

FIG. 8: implanting, at high energy, n-doping ions into the enhanced p-doping regions, partially compensating the p-doping and thus creating, at predetermined depth under the surface, regions 804 having a net p-doping lower than that of the p-type semiconductor remote from the transistor active area;

FIG. 8: removing the second photoresist layer;

FIG. 9: depositing conformal insulating layers of an insulator, such as silicon nitride or silicon dioxide, over the surface and directional plasma etching this insulating layers so that only side walls 901 around the poly-silicon gate remain;

FIG. 9: depositing a third photoresist layer and opening a window therein, exposing the surface of the area between the isolation regions;

FIG. 9: implanting, at medium energy, n-doping ions into the exposed surface area, creating an n-doped region that extends to a medium depth under the surface, suitable as deep source 902 and drain 903 of the transistor;

FIG. 9: removing the third photoresist layer;

FIG. 10: forming silicides 1001, 1002, and 1003;

forming contacts; and depositing the metallizations.

It is advisable to add the process step of annealing the high energy implant at elevated temperature. Of course, the process steps can be modified by implanting the n-doping ions at high energy after the process step of implanting the n-doping ions at medium energy.

For fabricating a PMOS transistor according to the method of the present invention, the flow of the above process steps applies in analogous fashion with a reversal of conductivity types.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. An integrated circuit fabricated in a semiconductor of a first conductivity type, said circuit having at the surface at least one lateral MOS transistor bordered on each side by an isolation region and below said surface by a channel stop region, comprising:

a source and a drain, each comprising at said surface two regions of the opposite conductivity type, one of said regions shallow and extending to the transistor gate, the other of said regions deeper and recessed from said gate, together defining the active area of said transistor and having a depletion region when reverse biased;

said shallow regions surrounded in part by an enhanced doping implant region of the first conductivity type;

another semiconductor region, of said first conductivity type, located in each of said enhanced doping regions, having a resistivity higher than the remainder of said semiconductor, and each extending laterally approximately from the inner border of said respective shallow region to the inner border of said respective recessed region; and said high resistivity regions extending vertically from a depth just below the depletion regions of said source and drain to approximately the top of said channel stop region.

2. The circuit according to claim 1 wherein said semiconductor of the first conductivity type is a semiconductor epitaxial layer.

3. The circuit according to claim 1 wherein said semiconductor material is selected from a group consisting of silicon, silicon germanium, gallium arsenide, and any other semiconductor material used in integrated circuit fabrication.

4. The circuit according to claim 1 wherein said regions Of higher resistivity within said semiconductor of the first conductivity type have a resistivity at least an order of magnitude higher than the resistivity of said semiconductor of the first conductivity type.

5. The circuit according to claim 1 wherein said depletion regions have a depth of about 40 to 50 nm from said surface so that said high resistivity regions extend vertically from about 50 to 150 nm from said surface.

6. The circuit according to claim 1 wherein said semiconductor of the first conductivity type is made of p-type silicon in the resistivity range from about 1 to 50 $\Omega$cm, and said source, drain, and their extensions are made of n-type silicon.

7. The circuit according to claim 1 wherein said semiconductor of the first conductivity type has a dopant species selected from a group consisting of boron, aluminum, gallium, and indium, while said source, drain, their extensions, and said region of higher resistivity within said semiconductor of the first conductivity type have a dopant species selected from a group consisting of arsenic, phosphorus, antimony, and bismuth.

8. The circuit according to claim 1 wherein said semiconductor of the first conductivity type is made of n-type silicon in the resistivity range from about 1 to 50 $\Omega$cm, and said source, drain, and their extensions are made of p-type silicon.

9. The circuit according to claim 1 wherein said semiconductor of the first conductivity type has a dopant species selected from a group consisting of arsenic, phosphorus, antimony, bismuth, and lithium, while said source, drain, their extensions, and said regions of higher resistivity within said semiconductor of the first conductivity type have a dopant species selected from a group consisting of boron, aluminum, gallium, indium, and lithium.

10. The circuit according to claim 1 wherein said gate has a narrow dimension smaller than about 0.2 $\mu$m.

11. The circuit according to claim 1 wherein said regions of higher resistivity enhance the gain of the lateral bipolar transistor and thus the ESD protection of said MOS transistor, especially the current needed for initiating thermal breakdown, without decreasing latch-up robustness or increasing inadvertent substrate current-induced body biasing of neighboring transistors.

\* \* \* \* \*